(12) United States Patent
Goto

(10) Patent No.: US 8,064,042 B2
(45) Date of Patent: Nov. 22, 2011

(54) EXPOSURE APPARATUS AND DEVICE FABRICATION METHOD

(75) Inventor: Yoshio Goto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 647 days.

(21) Appl. No.: 12/062,804

(22) Filed: Apr. 4, 2008

(65) Prior Publication Data

US 2008/0259305 A1 Oct. 23, 2008

(30) Foreign Application Priority Data

Apr. 20, 2007 (JP) ................................. 2007-112289

(51) Int. Cl.
*G03B 27/54* (2006.01)
*G03B 27/72* (2006.01)

(52) U.S. Cl. ........................................... 355/67; 355/71

(58) Field of Classification Search .................... 355/67, 355/53
See application file for complete search history.

(56) References Cited

U.S. PATENT DOCUMENTS

| 6,574,039 B1 * | 6/2003 | Murata et al. ................. 359/359 |
| 7,057,820 B2 | 6/2006 | Kawashima |
| 2002/0191168 A1 * | 12/2002 | Ishizawa et al. ............... 355/53 |
| 2003/0020893 A1 | 1/2003 | Kawashima |
| 2005/0151942 A1 | 7/2005 | Kawashima |
| 2005/0225737 A1 * | 10/2005 | Weissenrieder et al. ........ 355/53 |
| 2005/0237502 A1 | 10/2005 | Kawashima |

FOREIGN PATENT DOCUMENTS

| JP | 2003-017396 A | 1/2003 |
| JP | 2006-303340 A | 11/2006 |

* cited by examiner

*Primary Examiner* — Peter B Kim
(74) *Attorney, Agent, or Firm* — Canon U.S.A., Inc. IP Division

(57) ABSTRACT

The present invention provides an exposure apparatus comprising an illumination optical system configured to illuminate a reticle with a light beam from a light source, and a projection optical system which is configured to project a pattern of the reticle onto a substrate, and has a numerical aperture of not less than 0.7, the projection optical system including an optical member on which an antireflection coating configured to suppress reflection of the light beam is formed and which is arranged closest to the substrate, wherein a reflectance of the antireflection coating with respect to the light beam is minimum at an incident angle of not less than 30°.

9 Claims, 15 Drawing Sheets

FIG. 6

| | MATERIAL | REFRACTIVE INDEX | FILM THICKNESS |
|---|---|---|---|
| SEAL GLASS | QUARTZ | 1.51 | |
| FIRST LAYER | MgF2 | 1.41 | 76.3 |
| SECOND LAYER | Al2O3 | 1.67 | 71.0 |
| THIRD LAYER | MgF2 | 1.41 | 50.5 |
| FOURTH LAYER | Al2O3 | 1.67 | 43.8 |
| FIFTH LAYER | MgF2 | 1.41 | 48.3 |

F I G. 15
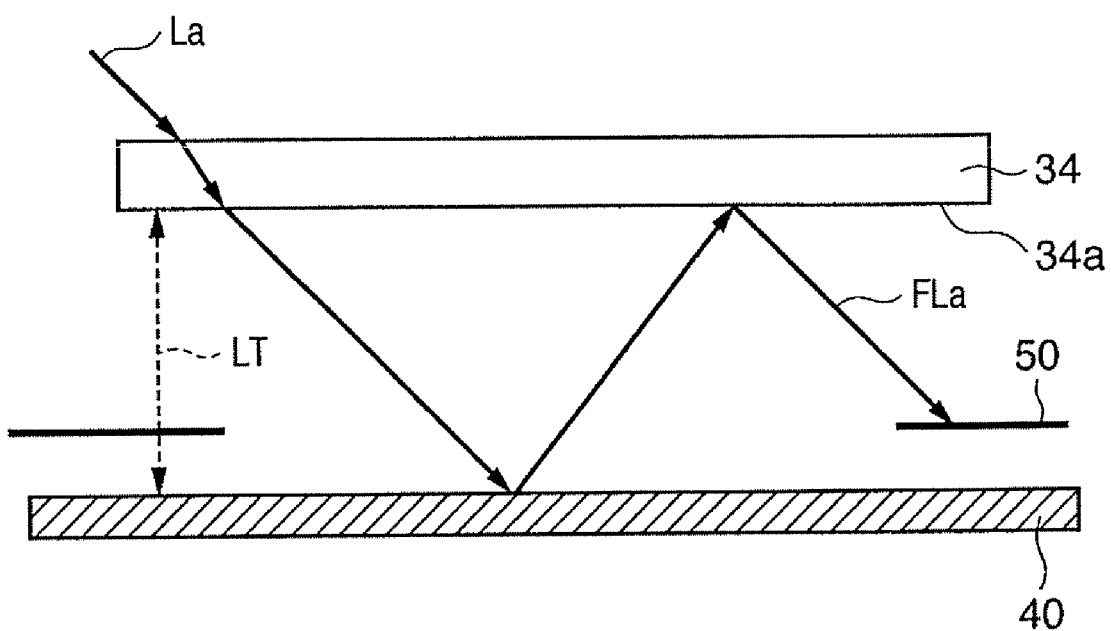

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus has conventionally been employed to fabricate a semiconductor device using photolithography. The projection exposure apparatus projects and transfers a circuit pattern formed on a reticle (mask) onto, for example, a wafer via a projection optical system using the step & repeat scheme or step & scan scheme.

A minimum dimension (resolution) that a projection exposure apparatus can transfer is proportional to the wavelength of exposure light and is inversely proportional to the numerical aperture (NA) of a projection optical system. Along with the recent demand for micropatterning semiconductor devices, the wavelength of exposure light is shortening and the NA of a projection optical system is increasing. For example, the recent exposure light source is shifting from a conventional super-high pressure mercury lamp (g-line (wavelength: about 265 nm)) to a KrF excimer laser (wavelength: about 248 nm) and ArF excimer laser (wavelength: about 193 nm) each having a wavelength shorter than that of the mercury lamp. An exposure apparatus (scanner) of the step & repeat scheme which uses a KrF excimer laser or ArF excimer laser as an exposure light source has a projection optical system with an NA of 0.7 to 0.95. In recent years, an optical system (immersion optical system) which attains an NA of 1 or more by the so-called immersion which fills the space between a wafer and the final optical lens (final surface) of the projection optical system with a liquid is under development to further increase the NA of a projection optical system.

As the NA of a projection optical system increases, the incident angle of a light beam which enters an optical element near a wafer also increases. The light beam is reflected by the surfaces of the optical element and the wafer (a resist applied on the wafer), so the amount of flare light which reaches inside/outside shot regions increases. For example, if the NA of a projection optical system is less than 0.7, the reflectances of both the final lens (a lens arranged closest to a wafer) of the projection optical system and the surface of a wafer are relatively low, and therefore flare light is negligible. However, if the NA of a projection optical system is 0.7 or more, the reflectances of both the final lens of the projection optical system and the surface of a wafer are relatively high, and therefore the amount of flare light is too large to neglect. The flare light herein generally refers to light which reaches a wafer after multiple reflections at various positions (the peripheral surfaces (edges) of lenses of a projection optical system and the metallic inner surface of a lens barrel).

Flare light in a given shot region generally scatters into its adjacent shot regions. When a plurality of shot regions on a wafer are exposed to light, the amount of flare light which scatters into one shot region is amplified. As a consequence, a pattern is transferred with a size changed from that defined by the design rule by even several tens of nanometers depending upon the shot. This makes it impossible to obtain a desired resolution (exposure performance).

Under these circumstances, Japanese Patent Laid-Open Nos. 2003-17396 and 2006-303340 propose techniques of reducing the adverse influence of flare light on the exposure performance.

Unfortunately, neither prior art techniques can sufficiently reduce the adverse influence of flare light on the exposure performance and avoid a decrease in exposure performance.

For example, Japanese Patent Laid-Open No. 2003-17396 proposes a technique of interposing a stop for shielding flare light between a wafer and the final lens of a projection optical system. However, merely interposing the stop between the wafer and the final lens is insufficient to prevent flare light which passes through the opening of the stop.

Japanese Patent Laid-Open No. 2006-303340 discloses a technique of setting the formation condition of an antireflection coating so that no light is reflected between a wafer and the final lens of a projection optical system (i.e., so that their reflectances become sufficiently low). However, on a resist and antireflection coating, regions in each of which light enters at a relatively large incident angle have relatively high reflectances in principle. This makes it very difficult to form an antireflection coating so that no light is reflected. Furthermore, Japanese Patent Laid-Open No. 2006-303340 does not describe a specific film composition and numerical values.

SUMMARY OF THE INVENTION

The present invention provides an exposure apparatus which can obtain an excellent exposure performance even when a projection optical system has an NA of 0.7 or more.

According to one aspect of the present invention, there is provided an exposure apparatus comprising an illumination optical system configured to illuminate a reticle with a light beam from a light source, and a projection optical system which is configured to project a pattern of the reticle onto a substrate, and has a numerical aperture of not less than 0.7, the projection optical system including an optical member on which an antireflection coating configured to suppress reflection of the light beam is formed and which is arranged closest to the substrate, wherein a reflectance of the antireflection coating with respect to the light beam is minimum at an incident angle of not less than 30°.

According to another aspect of the present invention, there is provided an exposure apparatus comprising an illumination optical system configured to illuminate a reticle with a light beam from a light source, and a projection optical system which is configured to project a pattern of the reticle onto a substrate, and has a numerical aperture of not less than 0.7, the projection optical system including an optical member on which an antireflection coating configured to suppress reflection of the light beam is formed and which is arranged closest to the substrate, wherein a reflectance of the antireflection coating with respect to an S-polarized light component of the light beam is minimum at an incident angle of not less than 30°.

According to still another aspect of the present invention, there is provided an exposure apparatus comprising a projection optical system which is configured to project a pattern of a reticle onto a substrate, and has a numerical aperture of not less than 0.7, and a light-shielding unit which is interposed between the projection optical system and the substrate, and is configured to shield flare light, wherein the projection optical system includes an optical member arranged closest to the substrate, and wherein the optical member has, as a surface on a side of the reticle, a concave surface with a curvature radius of 1000 mm (inclusive) to 10000 mm (inclusive).

According to yet another aspect of the present invention, there is provided a device fabrication method comprising steps of exposing a substrate using the above exposure apparatus, and performing a development process for the substrate exposed.

Further aspects and features of the present invention will become apparent from the following description of exemplary embodiments with reference to the attached drawings.

BRIEF DESCRIPTION OF THE DRAWINGS

FIG. 6 is a table showing an example of the composition of the antireflection coating shown in FIGS. 5A and 5B.

FIG. 15 is a partial enlarged sectional view showing the vicinity of the wafer and the projection optical system of the exposure apparatus shown in FIG. 1.

DESCRIPTION OF THE EMBODIMENT

Figure 1:
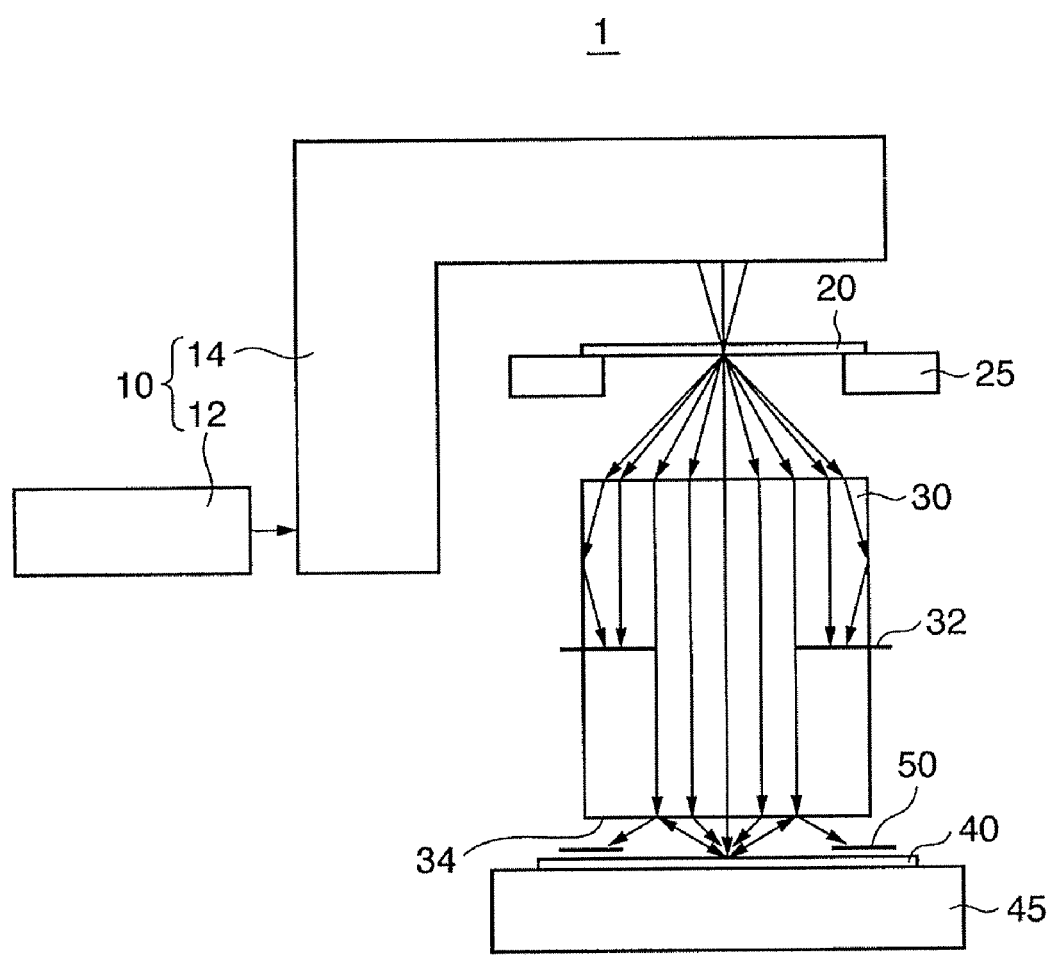
FIG. 1 is a schematic sectional view showing an exposure apparatus according to one aspect of the present invention.

A preferred embodiment of the present invention will be described below with reference to the accompanying drawings. The same reference numerals denote the same members throughout the drawings, and a repetitive description thereof will be omitted.

FIG. 1 is a schematic sectional view showing an exposure apparatus 1 according to one aspect of the present invention. In this embodiment, the exposure apparatus 1 is a projection exposure apparatus which transfers the pattern of a reticle 20 onto a wafer 40 by exposure using the step & scan scheme. However, the exposure apparatus 1 can adopt the step & repeat scheme. The exposure apparatus 1 may be an exposure apparatus (immersion exposure apparatus) of an immersion type which transfers the pattern of the reticle 20 onto the wafer 40 via a liquid supplied between a projection optical system 30 and the wafer 40. As shown in FIG. 1, the exposure apparatus 1 includes an illumination apparatus 10, a reticle stage 25, the projection optical system 30, a wafer stage 45, and a light-shielding unit 50.

The illumination apparatus 10 illuminates the reticle 20 on which a circuit pattern to be transferred is formed, and includes a light source unit 12 and illumination optical system 14.

The light source unit 12 uses, for example, an excimer laser as a light source. The excimer laser includes, for example, a KrF excimer laser with a wavelength of about 248 nm and an ArF excimer laser with a wavelength of about 193 nm. However, the light source unit 12 may use an $F_2$ laser with a wavelength of about 157 nm or a superhigh pressure mercury lamp as a light source.

The illumination optical system 14 illuminates the reticle 20. The illumination optical system 14 includes, for example, a lens, mirror, optical integrator, diffractive optical element, stop, masking blade, and scan blade. The illumination optical system 14 attains polarized illumination effective in increasing the NA of the projection optical system 30. More specifically, the illumination optical system 14 includes a polarizing plate which controls the polarization state of a light beam guided to the reticle 20. The polarizing plate can be inserted in and retracted from the optical path of the illumination optical system 14, and can illuminate the reticle 20 with random polarization which contains both S-polarized light and P-polarized light.

The reticle 20 has a circuit pattern and is supported and driven by the reticle stage 25. Diffracted light generated by the reticle 20 is guided to the projection optical system 30 with an NA higher (wider) than that of the light beam which is emitted by the illumination optical system 14 and illuminates the reticle 20. The diffracted light is then projected onto the wafer 40 via the projection optical system 30. Since the exposure apparatus 1 is of the step & scan scheme, it transfers the pattern of the reticle 20 onto the wafer 40 by scanning them.

The reticle stage 25 supports the reticle 20 and moves the reticle 20 in the X-axis direction, the Y-axis direction, the Z-axis direction, and the rotation directions about the respective axes using, for example, a linear motor. Note that the scanning direction of the reticle 20 or wafer 40 on its surface is defined as the Y-axis, a direction perpendicular to this direction on its surface is defined as the X-axis, and a direction perpendicular to the surface of the reticle 20 or wafer 40 is defined as the Z-axis.

The projection optical system 30 projects the pattern of the reticle 20 onto the wafer 40, and has a numerical aperture (NA) of 0.7 or more in this embodiment. The projection optical system 30 can be a dioptric system, catadioptric system, or catoptric system. The projection optical system 30 includes an aperture stop 32 and seal glass 34. The aperture stop 32 is used to guide the diffracted light which reflects the circuit pattern of the reticle 20 upon propagating through the reticle 20 to form an image on the wafer 40. The seal glass 34 serves as an optical member arranged on the final surface of the projection optical system 30. The final surface of the projection optical system 30 means a surface of the projection optical system 30, which is closest to the wafer 40 (substrate).

The aperture stop 32 is inserted at nearly the pupil position of the projection optical system 30. In this embodiment, the aperture stop 32 includes a variable aperture stop. The aperture stop 32 allows only a light beam having the same NA irrespective of whether it is on an on-axis or off-axis position along the optical axis of the projection optical system 30 in an exposure region to reach the image plane (wafer 40). In other words, the aperture stop 32 has a function of defining the NA of the projection optical system 30.

The seal glass 34 is a flat transparent member and has a function of adjusting the aberration of the projection optical system 30 and a function of isolating (purging) the projection optical system 30 from the stage space. For example, spherical aberration can be suppressed by adjusting the thickness of the seal glass 34, and astigmatism can be suppressed by adjusting its inclination with respect to an incident light beam. Using two seal glasses 34, coma aberration can be suppressed by minutely changing their inclination with respect to each other.

When an ArF excimer laser is used as a light source of the light source unit 12, light energy is so intense that a small amount of resist components may sublime upon exposure and be deposited on the final surface of the projection optical system 30 as impurities. When the deposition amount of impurities produced as sublimed resist components is very small, they do not adversely affect the transmittance and reflectance of the projection optical system 30. However, as the deposition amount of impurities gradually increases, they adversely affect the transmittance and reflectance of the projection optical system 30. A change in the transmittance of the projection optical system 30 causes illumination nonuniformity of an exposure region and a change in the reflectance of the projection optical system 30 increases the amount of flare light. For this reason, the seal glass 34 is preferably, exchangeably arranged on the final surface of the projection optical system 30. Using a parallel-plate as the seal glass 34 makes it possible to easily exchange it by angle adjustment alone (i.e., without position adjustment).

The wafer 40 is a substrate onto which the pattern of the reticle 20 is projected (transferred). However, it is also possible to use a glass plate or other substrates in place of the wafer 40. The wafer 40 is coated with a resist.

The wafer stage 45 supports the wafer 40 and moves the wafer 40 in the X-axis direction, the Y-axis direction, the Z-axis direction, and the rotation directions about the respective axes using a linear motor, like the reticle stage 25. When the exposure apparatus 1 is an immersion exposure apparatus, the wafer stage 45 has an arrangement compatible with it. For example, the wafer stage 45 may include a supply nozzle for supplying a liquid to the space between the projection optical system 30 and the wafer 40, and a recovery nozzle for recovering the liquid from the space between the projection optical system 30 and the wafer 40.

The light-shielding unit 50 is interposed between the projection optical system 30 and the wafer 40, and includes a plurality of light-shielding plates in this embodiment. The light-shielding unit 50 allows for exposing the wafer 40 to light, and shields the outside of an exposure-in-progress region on the wafer 40. The light-shielding unit 50 prevents a light beam (especially, a high-NA light beam) which has reached a wafer 40 coated with a resist from being reflected by the wafer 40 (resist), from being reflected by the projection optical system 30 again, and from reaching the wafer 40. In other words, the light-shielding unit 50 shields a flare light (a light beam unnecessary for imaging the pattern of the reticle 20 on the wafer 40) generated between the projection optical system 30 and the wafer 40. The light-shielding unit 50 may also have a function of shielding flare light generated as diffracted light from the reticle 20 is reflected by, for example, the edges of lenses of the projection optical system 30 and is further reflected by the inner surface of a lens barrel of the projection optical system 30, thereby preventing the flare light from reaching the wafer 40. However, the light-shielding unit 50 does not inhibit a light beam necessary for imaging the pattern of the reticle 20 on the wafer 40 from reaching the wafer 40. The exposure-in-progress region herein means a scanning region or an exposure region after one shot if the exposure apparatus 1 is an exposure apparatus (scanner) of the step & scan scheme. The exposure-in-progress region means an exposure region corresponding to one shot if the exposure apparatus 1 is an exposure apparatus (stepper) of the step & repeat scheme.

If the exposure apparatus 1 is a stepper, the light-shielding unit 50 may be fixed to (the lens barrel of) the projection optical system 30 or may be fixed on the wafer stage 45. However, since the exposure apparatus 1 is a scanner in this embodiment, the light-shielding unit 50 is preferably fixed to the projection optical system 30. This obviates the need for a mechanism which independently drives the light-shielding unit 50 in synchronism with scanning exposure. The expression "fixed" herein does not always mean that the light-shielding unit 50 is fixed to the projection optical system 30 using, for example, a screw. For example, the light-shielding unit 50 may be fixed to the main body system which mounts the wafer stage 45 using, for instance, a screw. Assume that the main body system which mounts the wafer stage 45 vibrates in canceling the reaction force of the wafer stage 45 upon driving it. Even in this case, when the vibration amount is too small to adversely affect the shielding of flare light, the light-shielding unit 50 is approximately regarded as being fixed to the projection optical system 30 although it in fact moves relative to the projection optical system 30.

Flare light will be explained in detail below. The principle that, when the NA of the projection optical system 30 becomes 0.7 or more (i.e., a light beam enters the wafer 40 at an incident angle which satisfies NA=0.7 or more), the amount of light beam reflected by the surface (resist) of the wafer 40 drastically increases will be explained first. The phrase "an incident angle which satisfies NA=0.7 or more" herein means an incident angle $\theta w$ ($0°\leq\theta w<90°$) at which a light beam enters the wafer 40 and which satisfies $nw \times \sin \theta w \geq 0.7$, where nw is the refractive index of a medium around the wafer 40. Since this embodiment assumes $nw \approx 1$, the phrase "an incident angle which satisfies NA=0.7 or more" means an incident angle $\theta w$ of about 44° or more.

To suppress reflection by the wafer 40 as a substrate, an antireflection layer is generally applied (formed) on the substrate and a resist is applied on the antireflection layer. The antireflection layer can suppress the reflectances of the wafer 40 with respect to both P-polarized light and S-polarized light to 10% or less when the incident angle is nearly 90° (i.e., the NA of the projection optical system 30 is 0). On the other hand, if no antireflection layer is formed on the substrate, the reflectance of the wafer 40 is several percent to 40% depending upon the resist thickness.

Figure 2:
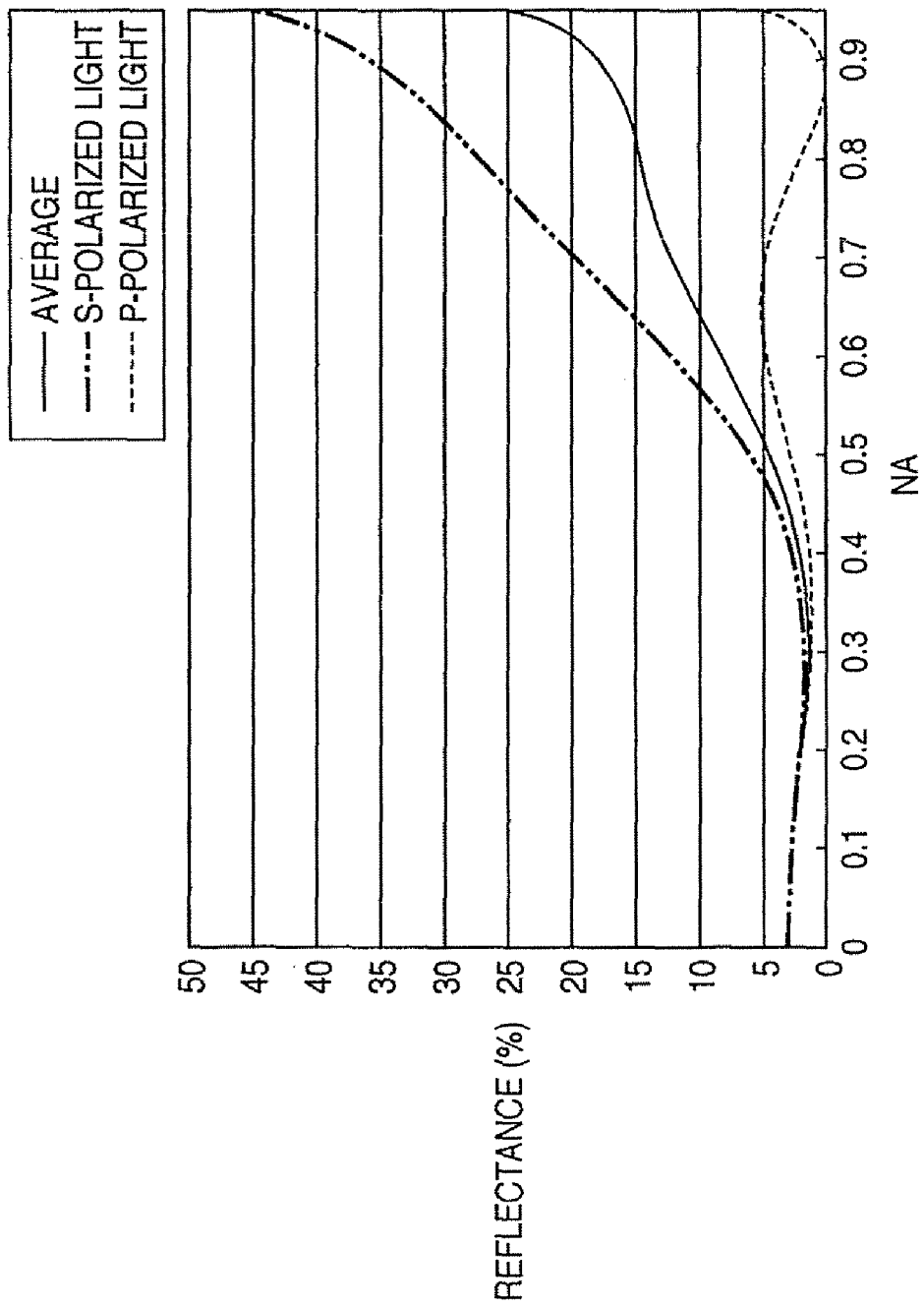
FIG. 2 is a graph showing the reflectance characteristic of the surface of a wafer with respect to the incident angle of a light beam.

FIG. 2 is a graph showing the reflectance characteristic of a wafer 40 obtained by forming an antireflection layer on a substrate and a resist is applied on the antireflection layer. In FIG. 2, the abscissa indicates the NA of the projection optical system 30 corresponding to the incident angle of a light beam (exposure light) which enters the wafer 40, and the ordinate indicates the reflectance of the surface of the wafer 40. FIG. 2 shows the reflectance with respect to P-polarized light in which the oscillation direction lies in a plane including the incident light and the normal to the wafer surface, the reflectance with respect to S-polarized light in which the oscillation direction lies in a plane perpendicular to the plane including the incident light and the normal to the wafer surface, and the average reflectance with respect to P-polarized light and S-polarized light.

Referring to FIG. 2, the reflectance with respect to P-polarized light begins to decrease as the NA exceeds about 0.3, and decreases up to nearly 0% around NA=0.85. In contrast, the reflectance with respect to S-polarized light falls within 10% up to about NA=0.6 although it gradually increases. However, the reflectance with respect to S-polarized light begins to drastically increase as the NA slightly exceeds about 0.6, and reaches about 40% around NA=0.93. Therefore, the average reflectance with respect to P-polarized light and S-polarized light begins to drastically increase as the NA slightly exceeds about 0.7, and reaches about 20% around NA=0.93.

Figure 3:
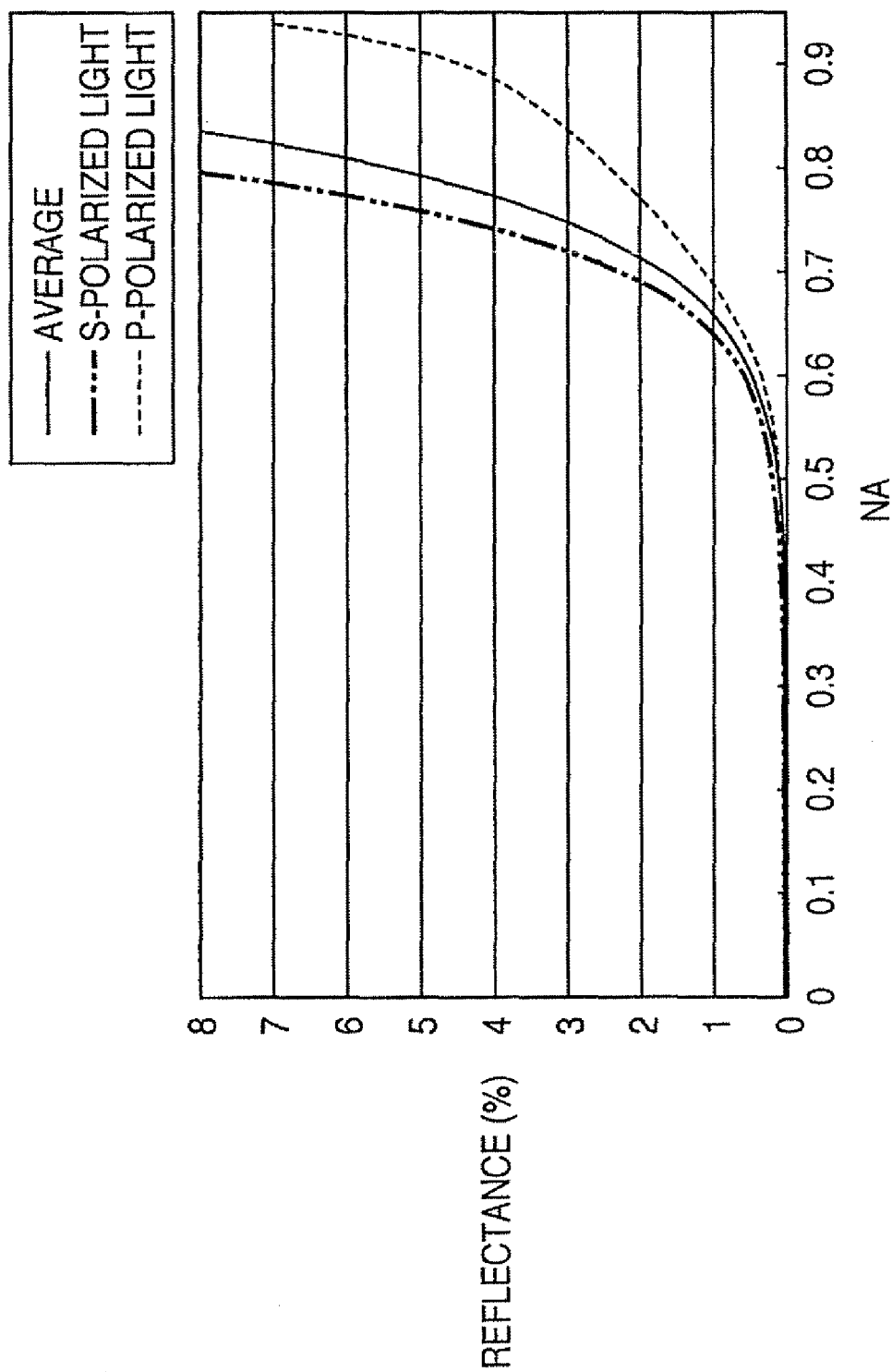
FIG. 3 is a graph showing the reflectance characteristic of the final surface of a projection optical system, on which a conventional antireflection coating is formed.

Reflection by the final surface (in this embodiment, the seal glass 34) of the projection optical system 30 will be explained next. An antireflection coating is generally formed on the final surface of the projection optical system 30. FIG. 3 is a graph showing the reflectance characteristic of the final surface of the projection optical system 30, on which a conventional antireflection coating is formed. In FIG. 3, the abscissa indicates the NA of the projection optical system 30 corresponding to the incident angle of a light beam which enters the final surface of the projection optical system 30, and the ordinate indicates the reflectance of the final surface of the projection optical system 30. FIG. 3 shows the reflectance with respect to P-polarized light, the reflectance with respect to S-polarized light, and the average reflectance with respect to P-polarized light and S-polarized light.

Referring to FIG. 3, since a conventional antireflection coating includes a multilayer film, it has an antireflection characteristic higher than that of the surface of the wafer 40. A conventional antireflection coating is generally designed to have a low normal incidence reflectance. However, the reflectances with respect to P-polarized light and S-polarized light gradually increase as the NA exceeds 0.5. In addition, since the conventional antireflection coating is designed in consideration of the average reflectance with respect to P-polarized light and S-polarized light, the reflectance with respect to S-polarized light is higher than that with respect to P-polarized light. The average reflectance with respect to P-polarized light and S-polarized light is about 2% around NA=0.7, and exceeds 5% around NA=0.93. This significantly decreases an antireflection effect. The conventional antireflection coating is designed to have a low normal incidence reflectance and maintain a relatively low reflectance even when the NA of incident light increases. However, both the reflectance with respect to S-polarized light and the average reflectance with respect to P-polarized light and S-polarized light are relatively high at an incident angle which satisfies NA=0.7 or more.

As can be understood from FIGS. 2 and 3, if the NA of the projection optical system 30 is less than 0.7, the reflectances of the surface of the wafer 40 and the final surface of the projection optical system 30 are relatively low, and therefore flare light is not problematic. However, if the NA of the projection optical system 30 is 0.7 or more, the reflectances of the surface of the wafer 40 and the final surface of the projection optical system 30 are relatively high. In this case, flare light is seriously problematic in attaining a sufficiently high NA (for example, NA=1.35) of the projection optical system 30. For example, if the NA of the projection optical system 30 is 0.85 or more, the reflectance of the surface of the wafer 40 with respect to S-polarized light is relatively high (about 40%) and that of the final surface of the projection optical system 30 with respect to S-polarized light is relatively high (8% or more) as well. Especially in this case, flare light is problematic.

Figure 4:
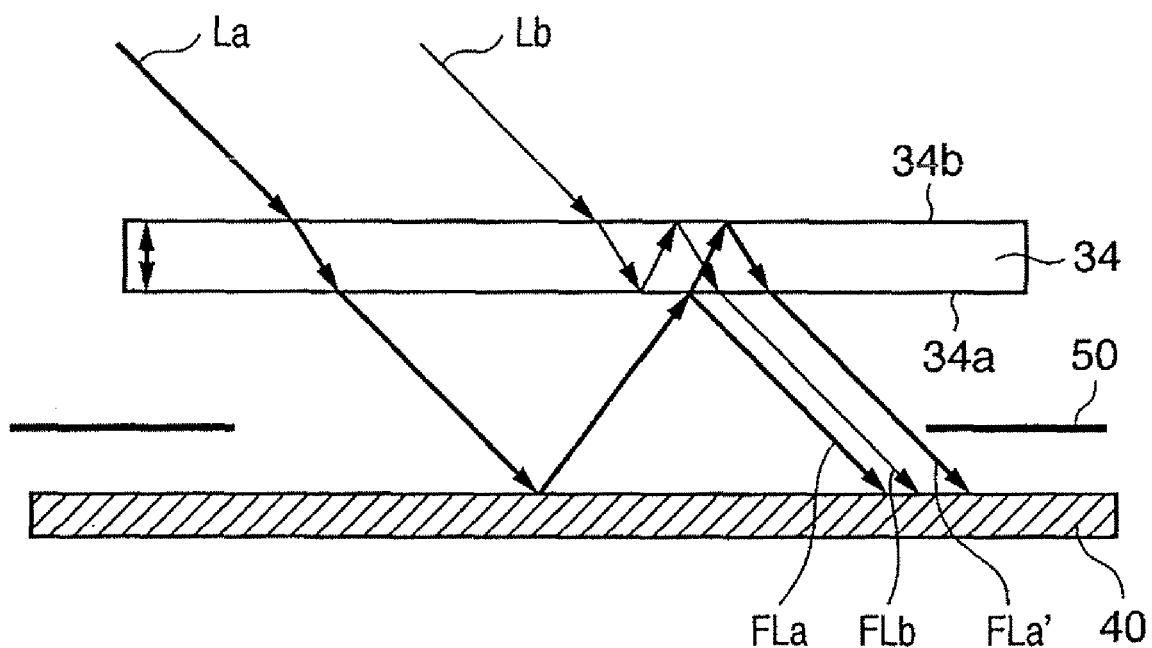
FIG. 4 is a partial enlarged sectional view showing the vicinity of a wafer and a projection optical system of the exposure apparatus shown in FIG. 1.

The flare light generated between the projection optical system 30 and the wafer 40 will be explained with reference to FIG. 4. FIG. 4 is a partial enlarged sectional view showing the vicinity of the projection optical system 30 and the wafer 40. For the sake of descriptive simplicity, this embodiment exemplifies flare light generated between the wafer 40 and the seal glass 34 as the final surface of the projection optical system 30. However, the same phenomenon occurs between optical members near the final surface of the projection optical system 30.

Referring to FIG. 4, a light beam La which has entered the seal glass 34 passes through the seal glass 34, and reaches a wafer 40 coated with a resist so that the resist is exposed to the light beam La. Note that a certain light component of the light beam La which has reached the wafer 40 is reflected by the surface of the wafer 40, is further reflected by a lower surface (wafer-side surface) 34a of the seal glass 34, and reaches the wafer 40 as a flare light FLa. A remaining light component of the light beam La which has reached the wafer 40 is reflected by the surface of the wafer 40, is transmitted through the seal glass 34, is further reflected by an upper surface (reticle-side surface) 34b of the seal glass 34, and reaches the wafer 40 as a flare light FLa'.

A light beam Lb which has entered the seal glass 34 is reflected by the lower surface 34a of the seal glass 34, is further reflected by the upper surface 34b of the seal glass 34, and reaches the wafer 40 as a flare light FLb.

The flare lights FLa, FLa' and FLb are shielded by the light-shielding unit 50, as described above. However, as shown in FIG. 4, the flare lights FLa, FLa', and FLb which pass through the opening of the light-shielding unit 50 and reach the wafer 40 in fact exist, so the line width uniformity and contrast decrease.

Figure 5A:
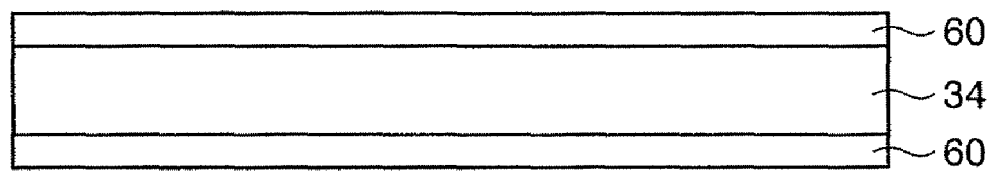
FIG. 5A is a sectional view showing an antireflection coating formed on the final surface of the projection optical system of the exposure apparatus shown in FIG. 1.
Figure 5B:
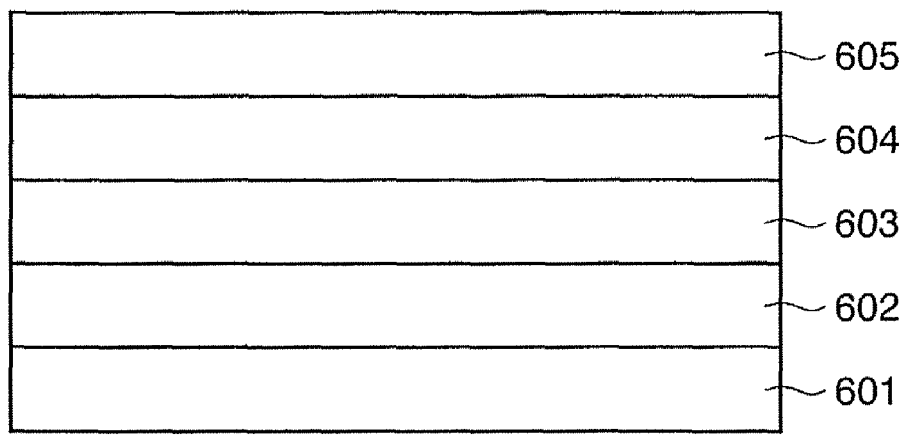
FIG. 5B is an enlarged sectional view showing the arrangement of the antireflection coating shown in FIG. 5A.

To solve this problem, in this embodiment, an antireflection coating 60 different from the conventional antireflection coating is formed on the seal glass 34 arranged on the final surface of the projection optical system 30, as shown in FIGS. 5A and 5B. The antireflection coating 60 suppresses light beam reflection, like the conventional antireflection coating. However, the antireflection coating 60 is designed to have a minimum reflectance with respect to P-polarized light, a minimum reflectance with respect to S-polarized light, and a minimum average reflectance with respect to P-polarized light and S-polarized light when the incident angle satisfies NA=0.5 or more. In other words, the antireflection coating 60 is not designed to have a minimum normal incidence reflectance but designed to have a minimum reflectance when the incident angle satisfies NA=0.5 or more. FIG. 5A is a sectional view showing an antireflection coating 60 formed on the final surface of the projection optical system 30. FIG. 5B is an enlarged sectional view showing the arrangement of the antireflection coating 60 shown in FIG. 5A. The phrase "the incident angle satisfies NA=0.5 or more" herein means that an incident angle $\theta f$ ($0° \leq \theta f < 90°$) at which a light beam enters the final surface satisfies $nf \times \sin \theta f \geq 0.5$, where nf is the refractive index of a medium around the final surface. Since this embodiment assumes $nf \approx 1$, the phrase "the incident angle satisfies NA=0.5 or more" means that the incident angle $\theta f$ is 30° or more.

The composition (film composition) of the antireflection coating 60 will be explained in detail. An optical thin film for ultraviolet rays is generally made of a material with a low refractive index such as magnesium fluoride, a material with a high refractive index such as aluminum oxide, cadmium fluoride, or samarium fluoride, or a material with a high reflectance such as aluminum (Al) or silver. As shown in FIG. 5B, the antireflection coating 60 according to this embodiment includes a first layer 601, second layer 602, third layer 603, fourth layer 604, and fifth layer 605 in turn from the side (optical member side) of the seal glass 34. Each of the first layer 601, third layer 603, and fifth layer 605 is made of a material with a refractive index lower than that of the seal glass 34. Each of the second layer 602 and fourth layer 604 is made of a material with a refractive index higher than that of the seal glass 34.

In this embodiment, each of the first layer 601, third layer 603, and fifth layer 605 of the antireflection coating 60 is made of magnesium fluoride ($MgF_2$) with a refractive index of 1.41, as shown in FIG. 6. Each of the second layer 602 and fourth layer 604 of the antireflection coating 60 is made of aluminum oxide ($Al_2O_3$) with a refractive index of 1.67. The seal glass 34 is made of quartz with a refractive index of 1.51. FIG. 6 also shows the film thicknesses of the first layer 601 to the fifth layer 605. FIG. 6 is a table showing an example of the composition of the antireflection coating 60.

Figure 7:
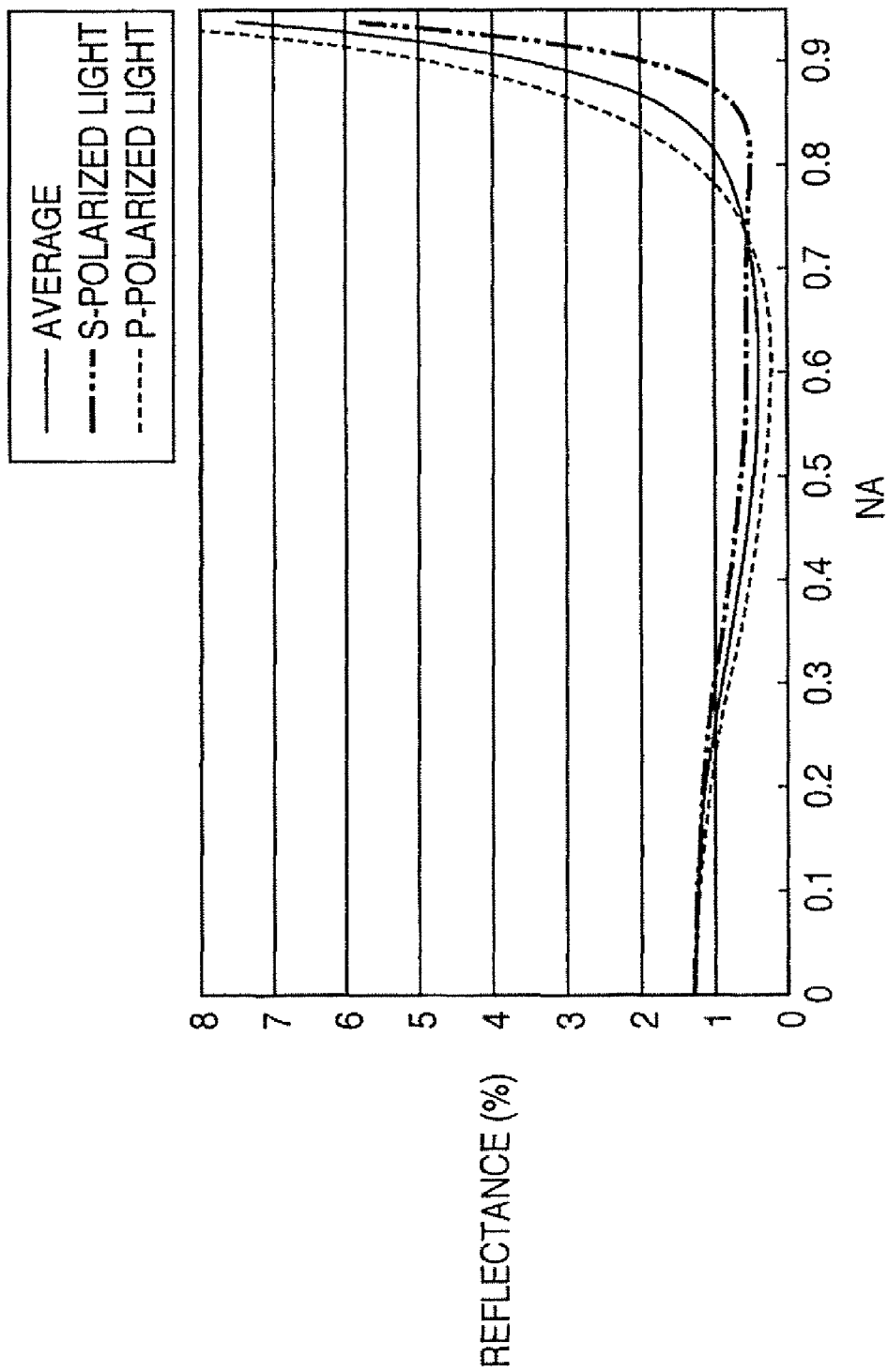
FIG. 7 is a graph showing the reflectance characteristic of the antireflection coating having the composition shown in FIG. 6.

FIG. 7 is a graph showing the reflectance characteristic of the antireflection coating 60 having the composition shown in FIG. 6. In FIG. 7, the abscissa indicates the NA of the projection optical system 30 corresponding to the incident angle of a light beam which enters the antireflection coating 60, and the ordinate indicates the reflectance of the antireflection coating 60. FIG. 7 shows the reflectance with respect to P-polarized light, the reflectance with respect to S-polarized light, and the average reflectance with respect to P-polarized light and S-polarized light, like FIGS. 2 and 3.

Referring to FIG. 7, the antireflection coating 60 has a minimum average reflectance with respect to P-polarized light and S-polarized around NA=0.6, and a minimum reflectance with respect to S-polarized light around NA=0.85. The antireflection coating 60 thus attains a low reflectance with respect to S-polarized light and a low average reflectance with respect to P-polarized light and S-polarized light in a region in which the NA is as high as 0.7 or more. More specifically, the average reflectance with respect to P-polarized light and S-polarized light of the antireflection coating 60 is less than 1.5% at an incident angle of 0° or more and less than 30°, and is less than 2.0% at an incident angle of 30° or more and less than 60°. The reflectance with respect to S-polarized light of the antireflection coating 60 is less than 1.5% at an incident angle of 0° or more and less than 30°, and is less than 1.0% at an incident angle of 30° or more and less than 60°. This makes it possible to reduce flare light (light amount) which is reflected by the surface of the wafer 40, is further reflected by the seal glass 34 arranged on the final surface of the projection optical system 30, and reaches the wafer 40. The antireflection coating 60 is preferably formed not only on the seal glass 34 but also on optical members arranged near the final surface of the projection optical system 30. This also makes it possible to reduce flare light which is reflected between the optical members arranged near the final surface of the projection optical system 30 and reaches the wafer 40.

Figure 8:
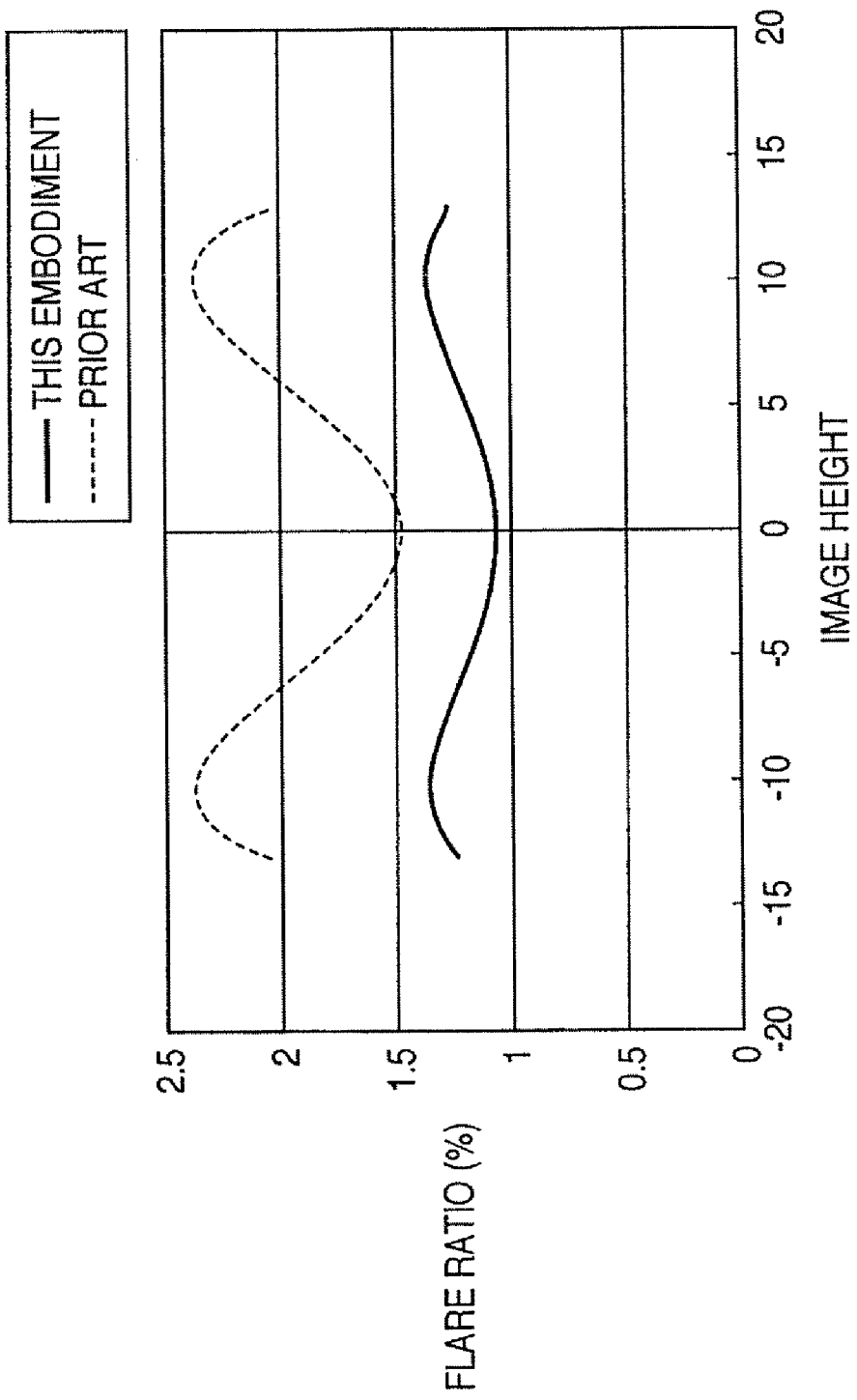
FIG. 8 is a graph showing the shot flare ratios when a conventional antireflection coating is used and when an antireflection coating according to this embodiment is used.

FIG. 8 is a graph showing the shot flare ratios when a conventional antireflection coating is used and when an antireflection coating 60 according to this embodiment is used. In FIG. 8, the abscissa indicates the image height, and the ordinate indicates the flare ratio. Referring to FIG. 8, the higher the image height, the higher the flare ratio. This is because flare light from an adjacent shot region has entered a given shot region. The image height difference due to the presence of such flare light decreases the line width uniformity. When the conventional antireflection coating is used, the maximum flare ratio is 2.37%, and the image height difference is 0.89%, as shown in FIG. 8. In contrast, when the antireflection coating 60 according to this embodiment is used, the maximum flare ratio is 1.36%, and the image height difference is 0.29%. The antireflection coating 60 according to this embodiment can reduce flare light which reaches inside/outside shot regions, thus simultaneously decreasing the absolute flare ratio and image height difference.

In this manner, the antireflection coating 60 can reduce flare light which reaches the wafer 40. Hence, the exposure apparatus 1 can obtain a stable imaging performance (excellent exposure performance) without decreasing the line width uniformity and contrast.

Figure 9:
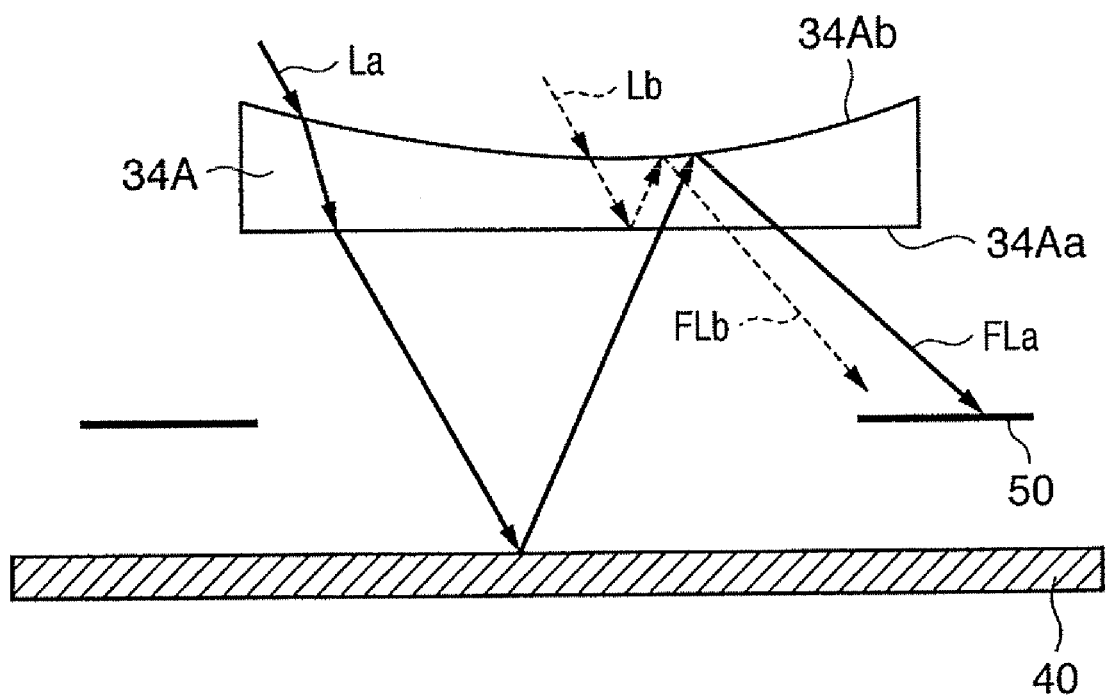
FIG. 9 is a partial enlarged sectional view showing the vicinity of the wafer and the projection optical system of the exposure apparatus shown in FIG. 1.

As shown in FIG. 9, when an upper surface (reticle-side surface) 34Ab of a seal glass 34A arranged on the final surface of the projection optical system 30 is formed into a concave surface with a curvature radius of 1000 mm (inclusive) to 10000 mm (inclusive), it is possible to reduce flare light which reaches the wafer 40. Since the upper surface 34Ab of the seal glass 34A has a curvature radius of 1000 mm (inclusive) to 10000 mm (inclusive), the seal glass 34A is easy to exchange. FIG. 9 is a partial enlarged sectional view showing the vicinity of the projection optical system 30 and the wafer 40.

In FIG. 9, the seal glass 34A arranged on the final surface of the projection optical system 30 is spaced apart from the wafer 40 by 5 mm or more. In other words, the distance between the seal glass 34A and the wafer 40 is 5 mm or more. As described above, the light-shielding unit 50 is interposed between the seal glass 34A and the wafer 40.

Referring to FIG. 9, a light beam La which has entered the seal glass 34A passes through the seal glass 34A, and reaches a wafer 40 coated with a resist so that the resist is exposed to the light beam La. Note that a certain light component of the light beam La which has reached the wafer 40 is reflected by the surface of the wafer 40, passes through a lower surface 34Aa of the seal glass 34A, and is further reflected by the upper surface 34Ab of the seal glass 34A. The light component reflected by the upper surface 34Ab of the seal glass 34A travels toward the wafer 40 as a flare light FLa. However, since the upper surface 34Ab of the seal glass 34A is a concave surface with a curvature radius of 1000 mm (inclusive) to 10000 mm (inclusive), the flare light FLa scatters farther than in the prior art and is shielded by the light-shielding unit 50.

A light beam Lb which has entered the seal glass 34A is reflected by the lower surface 34Aa of the seal glass 34A, is further reflected by the upper surface 34Ab of the seal glass 34A, and travels toward the wafer 40 as a flare light FLb. However, since the upper surface 34Ab of the seal glass 34A is a concave surface with a curvature radius of 1000 mm (inclusive) to 10000 mm (inclusive), the flare light FLb scatters farther than in the prior art and shielded by the light-shielding unit 50, like the flare light beam FLa.

Figure 10:
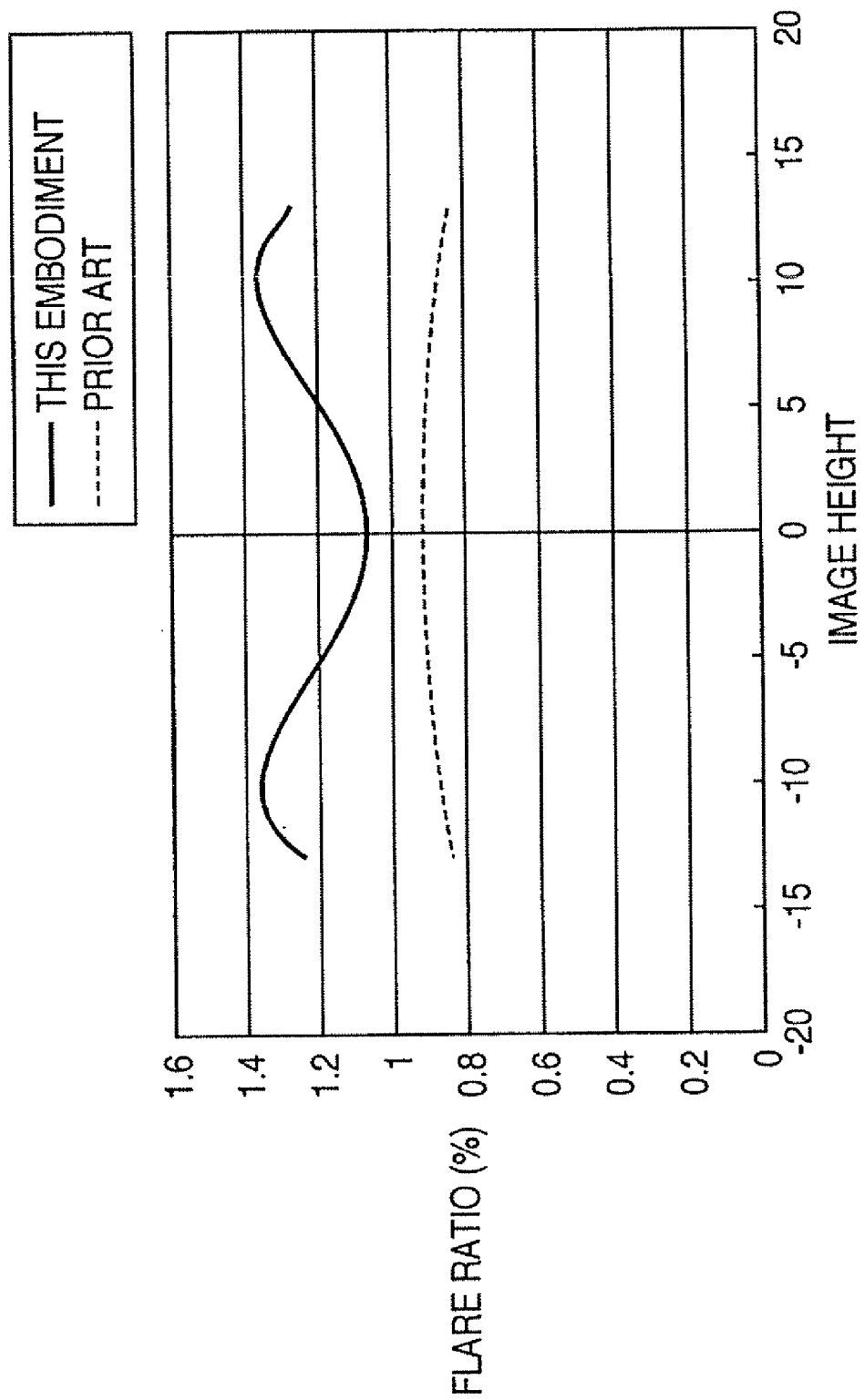
FIG. 10 is a graph showing the shot flare ratios when a seal glass having a conventional arrangement is used and when a seal glass having an arrangement according to this embodiment is used.

FIG. 10 is a graph showing the flare ratios when a seal glass having the conventional arrangement (the upper and lower surfaces have a parallel-plate shape) is used and when a seal glass 34A having the arrangement (the upper surface is a concave surface with a curvature radius of 1000 mm (inclusive) to 10000 mm (inclusive)) according to this embodiment is used. In FIG. 10, the abscissa indicates the image height, and the ordinate indicates the flare ratio. Referring to FIG. 10, when the seal glass having the conventional arrangement is used, the maximum flare ratio is 1.36%, and the image height difference is 0.29%. In contrast, when the seal glass 34A having the arrangement according to this embodiment is used, the maximum flare ratio is 0.91%, and the image height difference is 0.07%. The seal glass 34A can reduce flare light which scatters outside shot regions, thus simultaneously decreasing the absolute flare ratio and image height difference.

Figure 11:
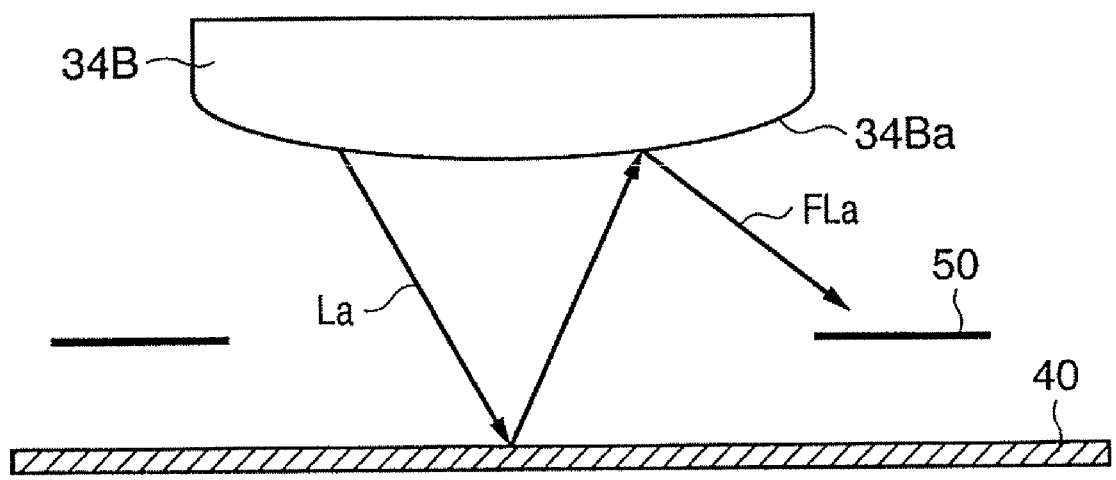
FIG. 11 is a partial enlarged sectional view showing the vicinity of the wafer and the projection optical system of the exposure apparatus shown in FIG. 1.

Likewise, as shown in FIG. 11, when a lower surface (substrate-side surface) 34Ba of a seal glass 34B arranged on the final surface of the projection optical system 30 is formed into a convex surface with a curvature radius of 1000 mm (inclusive) to 10000 mm (inclusive), it is possible to reduce flare light which reaches the wafer 40. FIG. 11 is a partial enlarged sectional view showing the vicinity of the projection optical system 30 and the wafer 40.

A light beam La which has entered the seal glass 34B passes through the seal glass 34B, and reaches a wafer 40 coated with a resist so that the resist is exposed to the light beam La. Note that a certain light component of the light beam La which has reached the wafer 40 is reflected by the surface of the wafer 40, and is further reflected by the lower surface 34Ba of the seal glass 34B. The light component reflected by the lower surface 34Ba of the seal glass 34B travels toward the wafer 40 as a flare light FLa. However, since the lower surface 34Ba of the seal glass 34B is a convex surface with a curvature radius of 1000 mm (inclusive) to 10000 mm (inclusive), the flare light FLa scatters farther than in the prior art and is shielded by the light-shielding unit 50. Since the lower surface 34Ba of the seal glass 34B has a curvature radius of 1000 mm (inclusive) to 10000 mm (inclusive), the seal glass 34B is easy to exchange.

Figure 12:
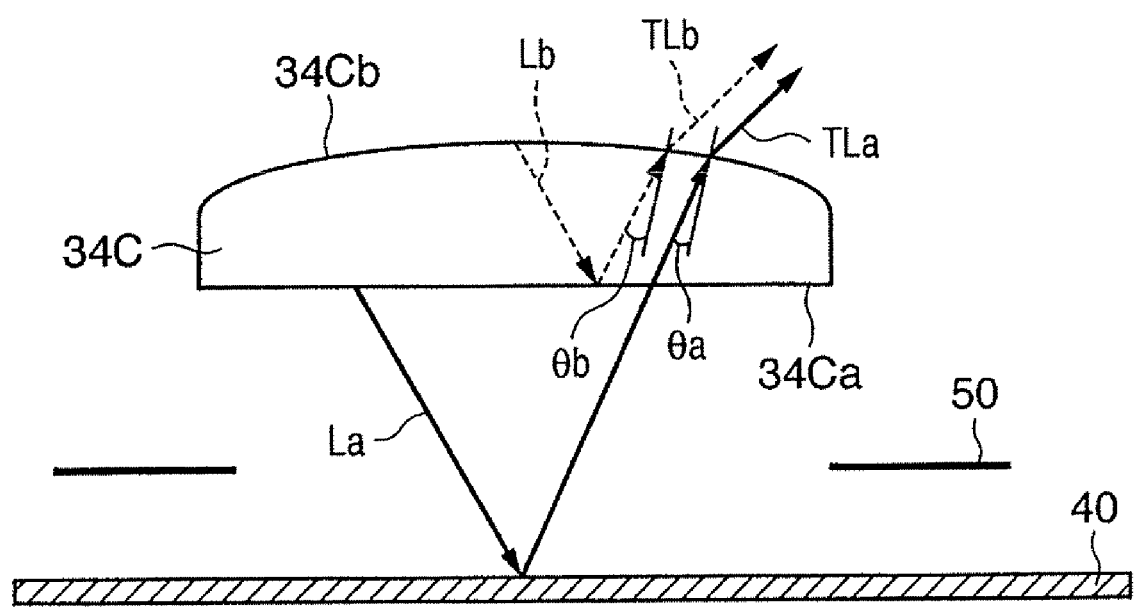
FIG. 12 is a partial enlarged sectional view showing the vicinity of the wafer and the projection optical system of the exposure apparatus shown in FIG. 1.

As shown in FIG. 12, when an upper surface (reticle-side surface) 34Cb of a seal glass 34C arranged on the final surface of the projection optical system 30 is formed into a convex surface with a curvature radius of 1000 mm (inclusive) to 10000 mm (inclusive), it is possible to reduce flare light which reaches the wafer 40. FIG. 12 is a partial enlarged sectional view showing the vicinity of the projection optical system 30 and the wafer 40.

Referring to FIG. 12, a light beam La which has entered the seal glass 34C passes through the seal glass 34C, and reaches a wafer 40 coated with a resist so that the resist is exposed to the light beam La. Note that a certain light component of the light beam La which has reached the wafer 40 is reflected by the surface of the wafer 40, passes through a lower surface 34Ca of the seal glass 34C, and reaches the upper surface 34Cb of the seal glass 34C. Since the upper surface 34Cb of the seal glass 34C is a convex surface with a curvature radius of 1000 mm (inclusive) to 10000 mm (inclusive), an incident angle θa of the light component which reaches the upper surface 34Cb of the seal glass 34C is relatively small. The light component which has reached the upper surface 34Cb of the seal glass 34C is transmitted through the upper surface 34Cb of the seal glass 34C, and emerges from it as a transmitted light beam TLa. For example, the transmitted light beam TLa is absorbed upon multiple reflection by the inner surface of the lens barrel of the projection optical system 30.

A light beam Lb which has entered the seal glass 34C is reflected by the lower surface 34Ca of the seal glass 34C, and reaches the upper surface 34Cb of the seal glass 34C. Since the upper surface 34Cb of the seal glass 34C is a convex surface with a curvature radius of 1000 mm (inclusive) to 10000 mm (inclusive), an incident angle θb of the light beam which reaches the upper surface 34Cb of the seal glass 34C is relatively small. The light beam which has reached the upper surface 34Cb of the seal glass 34C is transmitted through the upper surface 34Cb of the seal glass 34C, and emerges from it as a transmitted light beam TLb. For example, the transmitted light beam TLb is absorbed upon multiple reflection by the inner surface of the lens barrel of the projection optical system 30.

Figure 13:
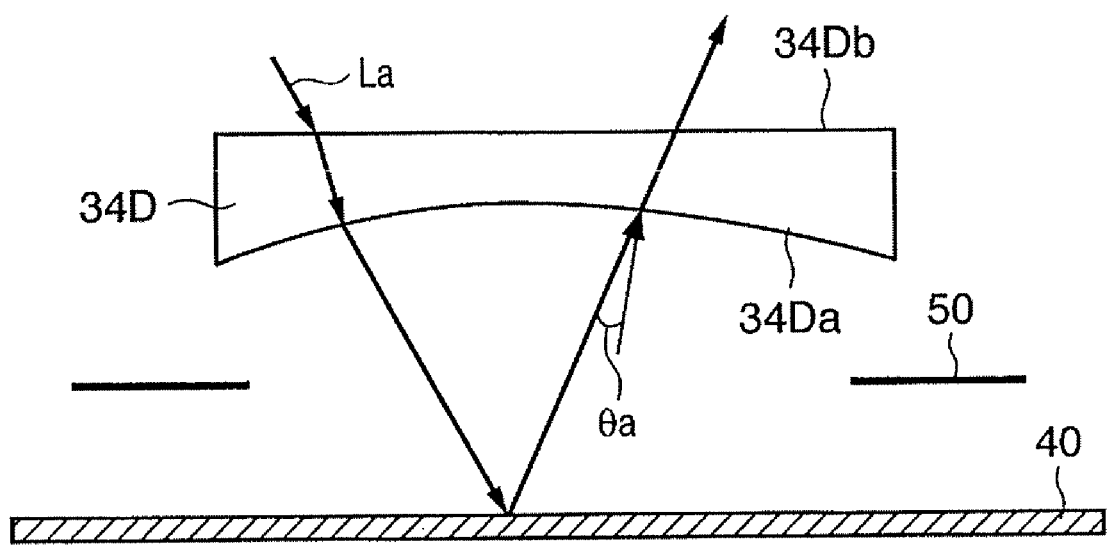
FIG. 13 is a partial enlarged sectional view showing the vicinity of the wafer and the projection optical system of the exposure apparatus shown in FIG. 1.

Likewise, as shown in FIG. 13, when a lower surface (substrate-side surface) 34Da of a seal glass 34D arranged on the final surface of the projection optical system 30 is formed into a concave surface with a curvature radius of 1000 mm (inclusive) to 10000 mm (inclusive), it is possible to reduce flare light which reaches the wafer 40. FIG. 13 is a partial enlarged sectional view showing the vicinity of the projection optical system 30 and the wafer 40.

Referring to FIG. 13, a light beam La which has entered the seal glass 34D passes through the seal glass 34D, and reaches a wafer 40 coated with a resist so that the resist is exposed to the light beam La. Note that a certain light component of the light beam La which has reached the wafer 40 is reflected by the surface of the wafer 40, and reaches the lower surface 34Da of the seal glass 34D. Since the lower surface 34Da of the seal glass 34D is a concave surface with a curvature radius of 1000 mm (inclusive) to 10000 mm (inclusive), an incident angle θa of the light component which reaches the lower surface 34Da of the seal glass 34D is relatively small. The light component which has reached the lower surface 34Da of the seal glass 34D is transmitted through the lower surface 34Da and an upper surface 34Db of the seal glass 34D, and emerges from the upper surface 34Db as a transmitted light beam TLa. For example, the transmitted light beam TLa is absorbed by the atmosphere upon multiple reflections by the inner surface of the lens barrel of the projection optical system 30.

In this manner, the seal glasses 34A to 34D each having a convex or concave upper surface or a convex or concave lower surface can reduce flare light which reaches the wafer 40. Combining the antireflection coating 60 with the seal glasses 34A to 34D makes it possible to more effectively reduce flare light. Hence, the exposure apparatus 1 can obtain a stable imaging performance (excellent exposure performance) without decreasing the line width uniformity and contrast.

Figure 14:
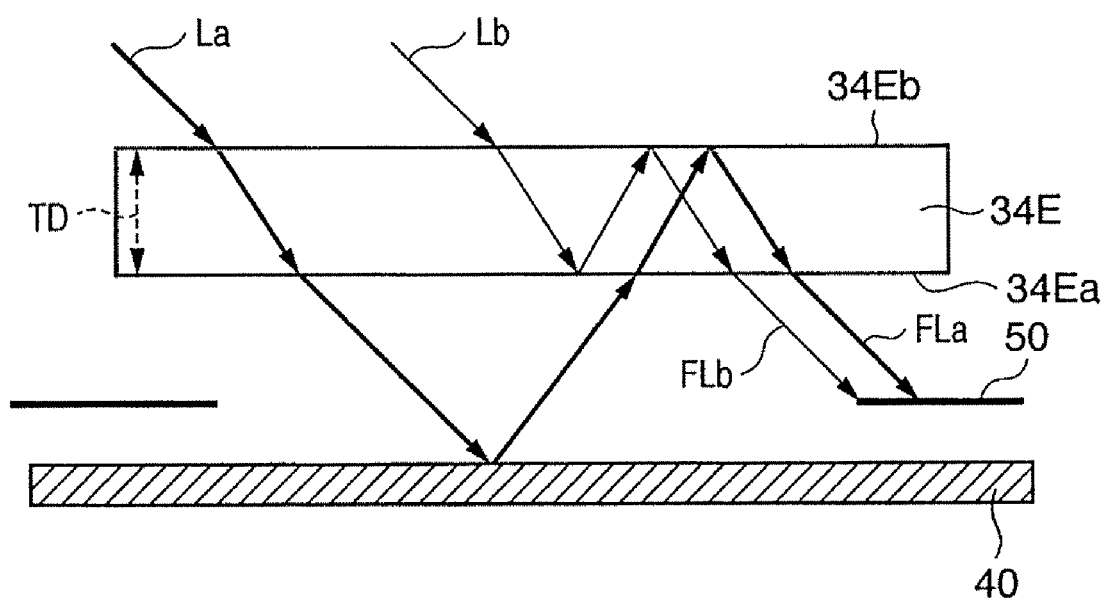
FIG. 14 is a partial enlarged sectional view showing the vicinity of the wafer and the projection optical system of the exposure apparatus shown in FIG. 1.

As shown in FIG. 14, when a thickness TD of a seal glass 34E arranged on the final surface of the projection optical system 30 is increased as compared with the prior art, it is possible to reduce flare light which reaches the wafer 40. More specifically, the seal glass 34E has a thickness TD of 5 mm or more and, in this embodiment, has a thickness TD of 6.5 mm. When the thickness TD of the seal glass 34E is set at 6.5 mm or more, it is possible to further improve the flare light reduction effect. FIG. 14 is a partial enlarged sectional view showing the vicinity of the projection optical system 30 and the wafer 40.

In FIG. 14, the distance between the wafer 40 and the seal glass 34E arranged on the final surface of the projection optical system 30 is 5 mm or more. As described above, the light-shielding unit 50 is interposed between the seal glass 34E and the wafer 40.

Referring to FIG. 14, a light beam La which has entered the seal glass 34E passes through the seal glass 34E, and reaches a wafer 40 coated with a resist so that the resist is exposed to the light beam La. Note that a certain light component of the light beam La which has reached the wafer 40 is reflected by the surface of the wafer 40, passes through a lower surface 34Ea of the seal glass 34E, and is further reflected by an upper surface 34Eb of the seal glass 34E. The light component reflected by the upper surface 34Eb of the seal glass 34E travels toward the wafer 40 as a flare light FLa. However, since the seal glass 34E has a thickness TD of 6.5 mm, the flare light FLa scatters by a longer distance than in the prior art and is shielded by the light-shielding unit 50.

A light beam Lb which has entered the seal glass 34E is reflected by the lower surface 34Ea of the seal glass 34E, is further reflected by the upper surface 34Eb of the seal glass 34E, and travels toward the wafer 40 as a flare light FLb. However, since the seal glass 34E has a thickness TD of 6.5 mm, the flare light FLb scatters by a longer distance than in the prior art and is shielded by the light-shielding unit 50, like the flare light FLa.

As shown in FIG. 15, when a distance LT between the wafer 40 and the seal glass 34 arranged on the final surface of the projection optical system 30 is increased as compared with the prior art, it is possible to reduce flare light which reaches the wafer 40. More specifically, the distance LT between the wafer 40 and the seal glass 34 is 5 mm or more and, in this embodiment, is 5 mm. FIG. 15 is a partial enlarged sectional view showing the vicinity of the projection optical system 30 and the wafer 40.

Referring to FIG. 15, a light beam La which has entered the seal glass 34 passes through the seal glass 34, and reaches a wafer 40 coated with a resist so that the resist is exposed to the light beam La. Note that a certain light component of the light beam La which has reached the wafer 40 is reflected by the surface of the wafer 40, is further reflected by the lower surface 34a of the seal glass 34, and travels toward the wafer 40 as a flare light FLa. However, since the distance LT between the seal glass 34 and the wafer 40 is 5 mm or more, the flare light FLa scatters by a longer distance than in the prior art and is shielded by the light-shielding unit 50.

In this manner, when the thickness TD of the seal glass 34E or the distance LT between the seal glass 34 and the wafer 40 is increased as compared with the prior art, it is possible to reduce flare light which reaches the wafer 40. Combining the antireflection coating 60 with the seal glass 34E makes it possible to more effectively reduce flare light. Hence, the exposure apparatus 1 can obtain a stable imaging performance (excellent exposure performance) without decreasing the line width uniformity and contrast.

In exposure, a light beam emitted by the light source unit 12 of the illumination apparatus 10 illuminates the reticle 20 via the illumination optical system 14. The light beam which reflects the pattern of the reticle 20 upon propagating through the reticle 20 forms an image on the wafer 40 via the projection optical system 30. Since the projection optical system 30 has a relatively high NA of 0.7 or more, the pattern of the reticle 20 is transferred onto the wafer 40 with high resolution. An antireflection coating 60 formed on an optical member (for example, the seal glasses 34 and 34A to 34E) arranged near the final surface of the projection optical system 30 and/or the optical member reduce flare light generated between the projection optical system 30 and the wafer 40. The light-shielding unit 50 also effectively shields flare light generated between the projection optical system 30 and the wafer 40 to prevent decreases in line width uniformity and contrast. Hence, the exposure apparatus 1 can maintain an excellent exposure performance and provide devices (for example, a semiconductor device, an LCD device, an image sensing device (for example, a CCD), and a thin-film magnetic head) with high throughput and high quality.

A description will be given of an embodiment of a device fabrication method using the above mentioned exposure apparatus 1. The device is fabricated by a step of exposing a substrate coated with a resist (wafer or glass plate) using the exposure apparatus 1, a step of performing a development process for the substrate exposed, and a step of performing other well-known processes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-112289 filed on Apr. 20, 2007, which is hereby incorporated by reference herein in its entirely.

What is claimed is:

1. An exposure apparatus comprising:
   an illumination optical system configured to illuminate a reticle with a light beam from a light source; and
   a projection optical system which is configured to project a pattern of the reticle onto a substrate, and has a numerical aperture of not less than 0.7,
   said projection optical system including an optical member on which an antireflection coating configured to suppress reflection of the light beam is formed and which is arranged closest to the substrate,
   wherein said illumination optical system includes a polarizing plate which controls a polarization state of a light beam guided to the reticle, and illuminates the reticle with S-polarized light by using the polarizing plate, and
   a reflectance with respect to S-polarized light of the antireflection coating at an incident angle of 30° or more and less than 60° is lower than a reflectance with respect to S-polarized light of the antireflection coating at an incident angle of 0° or more and less than 30°.

2. The apparatus according to claim 1, wherein a reflectance with respect to S-polarized light of the antireflection coating is less than 1.5% at an incident angle of 0° or more and less than 30°, and is less than 1.0% at an incident angle of 30° or more and less than 60°.

3. A device fabrication method comprising steps of:
   exposing a substrate using an exposure apparatus according to claim 1; and
   performing a development process for the substrate exposed.

4. The apparatus according to claim 1, wherein the antireflection coating includes a first layer, a second layer, a third layer, a fourth layer, and a fifth layer in turn from a side of the optical member,
   each of the first layer, the third layer, and fifth layer is made of a material with a refractive index lower than a refractive index of the optical member, and
   each of the second layer and the fourth layer is made of a material with a refractive index higher than the refractive index of the optical member.

5. The apparatus according to claim 4, wherein
   each of the first layer, the third layer, and the fifth layer includes magnesium fluoride, and
   each of the second layer and the fourth layer includes aluminum oxide.

6. The apparatus according to claim 1, wherein the optical member includes a parallel-plate which is exchangeably arranged on said projection optical system.

7. The apparatus according to claim 1, further comprising a light-shielding unit which is interposed between said projection optical system and the substrate, and is configured to shield flare light.

8. The apparatus according to claim 1, wherein the optical member has, as a surface on a side of the reticle, a concave surface with a curvature radius of 1000 mm (inclusive) to 10000 mm (inclusive).

9. The apparatus according to claim 1, wherein the optical member has, as a surface on a side of the substrate, a convex surface with a curvature radius of 1000 mm (inclusive) to 10000 mm (inclusive).

* * * * *